United States Patent [19]

O'Donoghue

[11] Patent Number: 5,712,571
[45] Date of Patent: Jan. 27, 1998

[54] APPARATUS AND METHOD FOR DETECTING DEFECTS ARISING AS A RESULT OF INTEGRATED CIRCUIT PROCESSING

[75] Inventor: Geoff O'Donoghue, Andover, Mass.

[73] Assignee: Analog Devices, Inc., Wilmington, Mass.

[21] Appl. No.: 552,373

[22] Filed: Nov. 3, 1995

[51] Int. Cl.$^6$ .................................................. G01R 31/02
[52] U.S. Cl. .......................... 324/539; 324/754; 324/719; 324/718; 437/8
[58] Field of Search ................................ 437/8; 324/539, 324/541, 66, 754, 756, 719, 758

[56] References Cited

U.S. PATENT DOCUMENTS

| | | | |
|---|---|---|---|
| 3,480,856 | 11/1969 | Scott | 324/66 |
| 3,728,616 | 4/1973 | Cheek | 324/66 |
| 4,835,466 | 5/1989 | Maly . | |
| 5,051,690 | 9/1991 | Maly . | |
| 5,514,974 | 5/1996 | Bouldin | 324/756 |

*Primary Examiner*—Ernest F. Karlsen
*Assistant Examiner*—Jose M. Solis
*Attorney, Agent, or Firm*—Iandiorio & Teska

[57] ABSTRACT

A probe card tester for detecting defects occurring as a result of integrated circuit processing of a substrate having a plurality of space to conductors with a contact at each end of each conductor, includes: a probe card tester including a set of parallel resistors for connecting at least one in parallel with each conductor and a set of series resistors for connecting together the ends of the conductors to form a series resistance and a number of probe elements, one corresponding to each end of each conductor, for interconnecting the parallel and series resistors with the conductors for detecting defects bridging the conductors.

19 Claims, 7 Drawing Sheets

| | | | | | | |
|---|---|---|---|---|---|---|
| | 9*$R_B$ | 9 Opens | | 8*$R_A$ | 0 Short | |
| | 8*$R_B$ | 8 Opens | | 7*$R_A$ | 1 Short | |
| | 7*$R_B$ | 7 Opens | | 6*$R_A$ | 2 Shorts | |
| | 6*$R_B$ | 6 Opens | | 5*$R_A$ | 3 Shorts | |
| | 5*$R_B$ | 5 Opens | | 4*$R_A$ | 4 Shorts | |
| | 4*$R_B$ | 4 Opens | | 3*$R_A$ | 5 Shorts | |
| | 3*$R_B$ | 3 Opens | | 2*$R_A$ | 6 Shorts | |
| | 2*$R_B$ | 2 Opens | | 1*$R_A$ | 7 Shorts | |
| | 1*$R_B$ | 1 Open | | | | |
| | 0*$R_B$ | 0 Open | | | | |
| | | | | | | |

One Shorting Defect

APPARATUS AND METHOD FOR DETECTING DEFECTS ARISING AS A RESULT OF INTEGRATED CIRCUIT PROCESSING

FIELD OF INVENTION

This invention relates to an apparatus and method for detecting defects arising as a result of integrated circuit processing; and more particularly to such an apparatus and method in which the resistance network used for detecting defects is disposed in the probe card tester remote from the substrate under test.

BACKGROUND OF INVENTION

Yield prediction and yield estimation are very important considerations in integrated circuit design and process development. Models exist for predicting yield, which is the number of expected good chips on a wafer to the total number of chips on the wafer; however, the accuracy of such models depends on the accuracy of the information that describes the defect size distribution and defect density on the wafer.

One such technique for detecting defects and determining defect size is described in U.S. Pat. No. 4,835,466, which is incorporated by reference herein in its entirety. The technique involves forming a plurality of test structures on a substrate such as a wafer surface. Each structure includes a meandering of polysilicon having a number of intermediate segments interconnected by a number of folded segments. On top of the polysilicon is formed an insulating layer and on top of the insulating layer and in alignment with the intermediate segments of polysilicon are formed a number of conductive metal strips. The metal strips are interconnected to the intermediate segments of polysilicon in parallel by contact vias and in series to the folded segments of polysilicon. The equivalent circuit from the beginning of the meander of each test structure to the end is a long chain of ideally equivalent resistors of conductive metal strips (very low resistance) and folded segments (much higher resistivity) interconnecting the metal strips. The metal strips effectively short out the intermediate segments of polysilicon when the structures are formed without defect. The electrical resistance of the test structure is measured through a number of electrical contacts to the folded segments. When a defect is formed during the process, either one that shorts two or more metal strips or one that results in an open (i.e., no metal) in one or more of the metal strips, a change in measured electrical resistance of the test structure is observed and the extent of change is then correlated to a particular size defect.

A short across two or more conductive strips causes a reduction in resistance from the resistance of the test structure without defects in an amount equal to the resistances of the folded segments shorted because of the defects. A defect which causes an open in one or more of the conductive metal strips results in an increased measured resistance in the test structure. This is because the intermediate segments of high resistance polysilicon underneath and connected in parallel with the open circuited conductive metal strips are introduced to the circuit.

The extent of increase or decrease in the resistance of the test structure can be used to determine the size of the defects detected, as the conductive metal strips are separated by a known distance. Thus, by knowing how many strips are affected by the defect, the size of the defect can be determined.

This technique has a number of shortcomings, however. First, the test structure having a complex resistance network must be repeatedly formed over the entire surface of the wafer under test. These test structures are formed by a fairly sophisticated and complex process requiring the formation of three layers of material, namely, polysilicon, insulator, and metal, on the wafer surface. Also, since it is not possible to etch all corresponding polysilicon segments within each test structure and from test structure to test structure over the wafer surface to precisely the same size, then the segments will not have precisely the same resistance. Accurate defect detection and sizing depends on accurate resistance measurements. Thus, because of the imprecise segment sizing, the resistances measured for a given defect size will vary and improper defect sizing is inevitable. Finally, only metal layers of material and not polysilicon layers of material can be tested for defects using the technique described in that patent.

SUMMARY OF INVENTION

It is therefore an object of this invention to provide an improved apparatus and method for detecting defects arising as a result of integrated circuit processing.

It is a further object of this invention to provide such an apparatus and method which produces more accurate and repeatable resistance measurements indicative of defect detection.

It is a further object of this invention to provide such an apparatus and method which requires a much simpler defect test structure which is easier and less expensive to fabricate.

It is a further object of this invention to provide such an apparatus and method which obviates the need for replicating the resistance network in each test structure.

It is a further object of this invention to provide such an apparatus and method which requires only a single layer test structure.

It is a further object of this invention to provide such an apparatus and method in which the test structure is not required to be metal.

The invention results from the realization that truly accurate and repeatable detection of defects arising as a result of integrated circuit processing can be achieved by using a set of series and of parallel resistors located on the probe card tester remote from a plurality of spaced conductors on a substrate to be tested and using a number of probe elements for interconnecting the parallel resistors one across each conductor and connecting the series resistors between the conductors to form a single series resistance for detecting defects bridging the conductors.

This invention features a probe card device for detecting defects occurring as a result of integrated circuit processing of a substrate having a plurality of spaced conductors with a contact at each end of each conductor. The probe card device includes a probe card tester including a set of parallel resistors for interconnecting at least one in parallel with each conductor and a set of series resistors for connecting together the ends of the conductors to form a series resistance. The probe card tester also includes a number of probe elements, one corresponding to each end of each conductor, for interconnecting the parallel and series resistors with the conductors for detecting defects bridging the conductors.

In a preferred embodiment the substrate may be an integrated circuit chip wafer. The conductors may be configured in a meandering pattern. The conductors may be substantially one micrometer in width and spaced one micrometer apart. There may further be included means for detecting defects bridging the conductors. The means for detecting may include means for measuring the resistance of the series resistance. The means for detecting may further include means, responsive to the means for measuring, for determining the size and type of defect bridging the conductors.

This invention also features an apparatus for detecting defects arising as a result of integrated circuit processing. The apparatus includes a substrate having a plurality of spaced conductors and a probe card tester. The probe card tester includes a set of parallel resistors for interconnecting at least one in parallel with each conductor and a set of series resistors for connecting together the ends of the conductors to form a series resistance. The probe card tester also includes a number of probe elements, one corresponding to each end of each conductor, for interconnecting the parallel and series resistors with the conductors for detecting defects bridging the conductors.

In a preferred embodiment the substrate may be an integrated circuit chip wafer. The conductors may be configured in a meandering pattern. Them may further be included means for detecting defects bridging the conductors. The means for detecting may include means for measuring the resistance of the series resistance. The means for detecting may further include means, responsive to the means for measuring, for determining the size and type of defect bridging the conductors.

This invention further features a method for detecting defects arising as a result of integrated circuit processing. The method includes fabricating a substrate having a plurality of spaced conductors. The method also includes forming, on a separate probe card tester, a set of parallel resistors for connecting at least one in parallel with each conductor and a set of series resistors for connecting together the ends of the conductors to form a series resistance. The method additionally includes interconnecting the parallel and series resistors with the conductors and detecting defects bridging the conductors.

In a preferred embodiment the substrate may be an integrated circuit chip wafer. The step of fabricating may include configuring the conductors in a meandering pattern. The conductors may be formed substantially one micrometer in width and spaced one micrometer apart. The step of detecting may further include measuring the resistance of the series resistance. The step of detecting may further include determining from the measured resistance the size and type of defects bridging the conductors.

DISCLOSURE OF PREFERRED EMBODIMENT

Other objects, features and advantages will occur to those skilled in the art from the following description of a preferred embodiment and the accompanying drawings, in which.

Figure 1A:
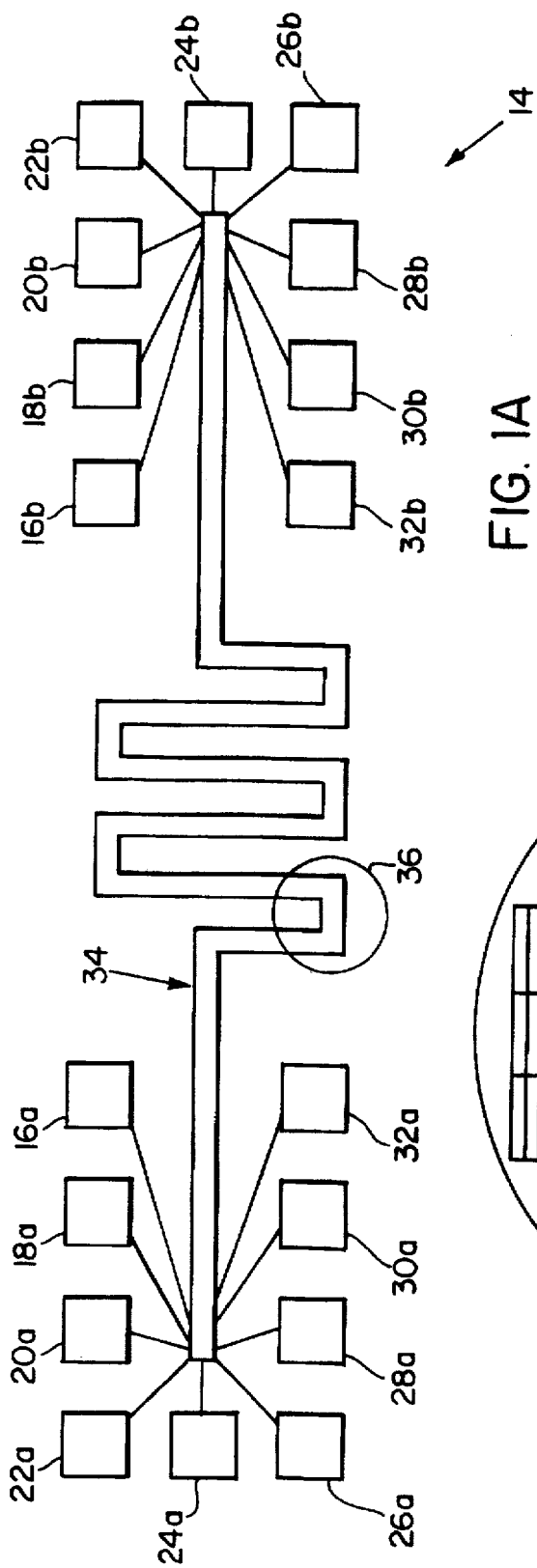
FIG. 1A is a schematic view of a test structure according to this invention which is located in each of the integrated circuit chip areas of FIG. 1.
Figure 1:
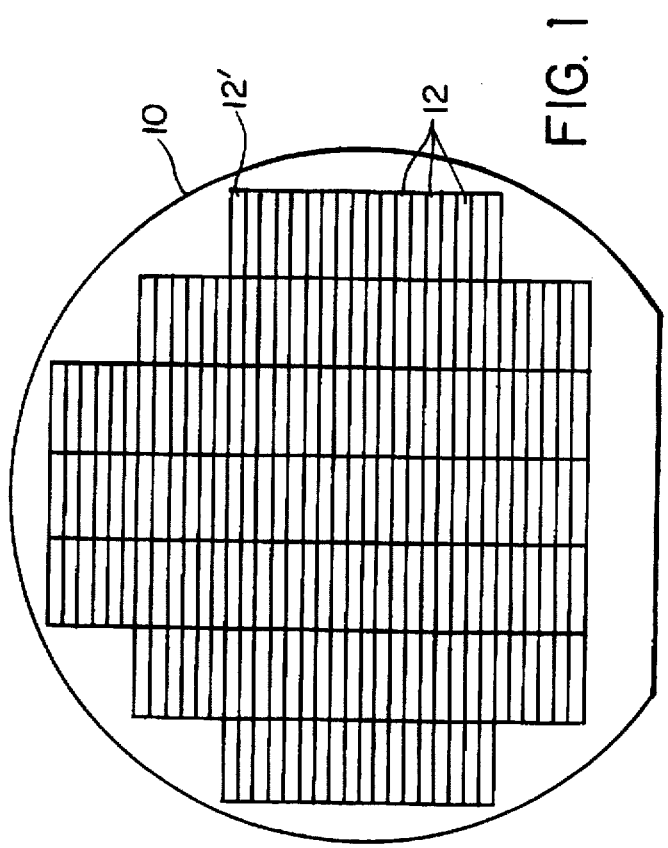
FIG. 1 is a top schematic view of a wafer having a plurality of integrated circuit chip areas.

There is shown in FIG. 1 a substrate 10 such as an integrated circuit chip wafer having thereon a plurality of areas 12 encompassing a large portion of the surface of wafer 10. Areas 12 correspond to areas on wafer 10 where integrated circuit chips are to be fabricated by a particular fabrication process or technology. However, before chips are actually produced by the fabrication process or at other times it is desirable to fabricate test structures in the areas where integrated circuit chips would normally be located in order to determine the number of defects and defect size on the wafer produced by the fabrication process so that the defect density can be determined and used as a predictive tool in determining chip yield in subsequent wafer processing runs for that same fabrication process. Test structure 14, FIG. 1A, according to this invention which is shown to be located at chip area 12', FIG. 1, is actually located at each area 12 on wafer 10 and each test structure is tested, as described below, to determine defect density.

Test structure 14 includes a number of sets of metal contact plates 16a and 16b, 18a and 18b, 20a and 20b, 22a and 22b, 24a and 24b, 26a and 26b, 28a and 28b, 30a and 30b, 32a and 32b. Each set of metal contact plates are interconnected by a long strip of metal formed on the surface of wafer 10 forming, in the aggregate, a meandering of metal strips 34 comprised of nine individual metal strips. The metal strips 34 are formed in a meandering pattern so that they cover a greater portion of surface area than if the strips were simply formed in a straight line, but they still only cover a small portion of each chip area 12. Although the area that the test structures cover is only approximately 10% of each chip area it is a sufficient amount of area to enable the apparatus and method of this invention to determine defect density for chips and wafers manufactured according to the fabrication process or technology which fabricated test structure 14.

Figures 2, 7:
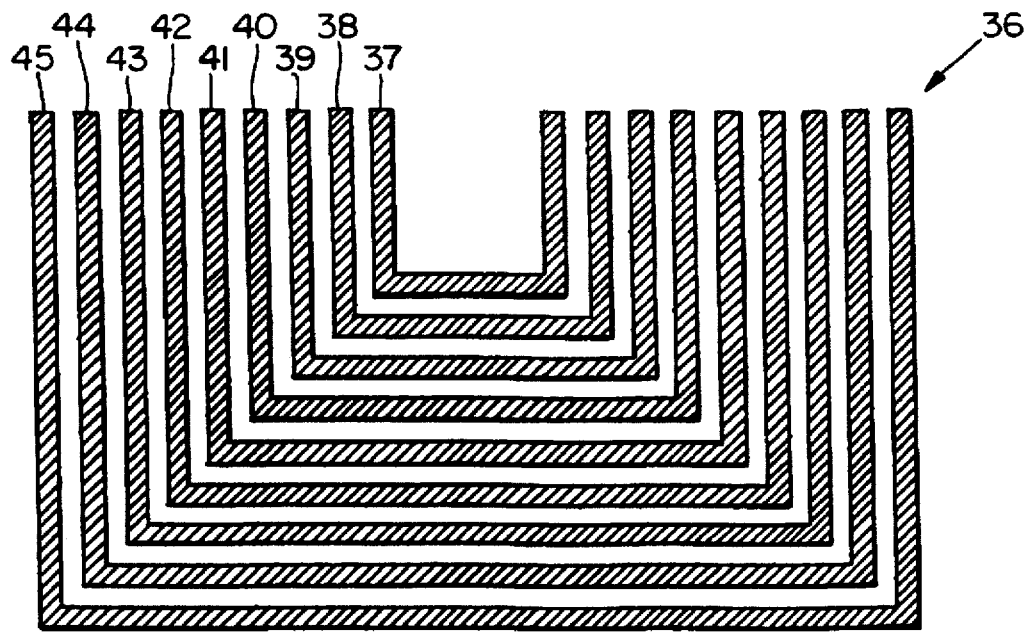
FIG. 2 is an enlarged view of one portion of the test structure of FIG. 1A.
FIG. 7 is a chart listing a variety of defects and the equivalent resistances measured as a result of these various types of defects.

A portion 36, FIG. 1A, of metal strips 34 is shown more in detail in FIG. 2. In this view it can be seen that the metal strips 34 are formed of nine individual metal strips 37–45 which are approximately 1 micrometer wide and spaced 1 micrometer apart. Strips 37–45 interconnect metal contact plate sets 16a and 16b through 32a and 32b, respectively.

Figure 3:
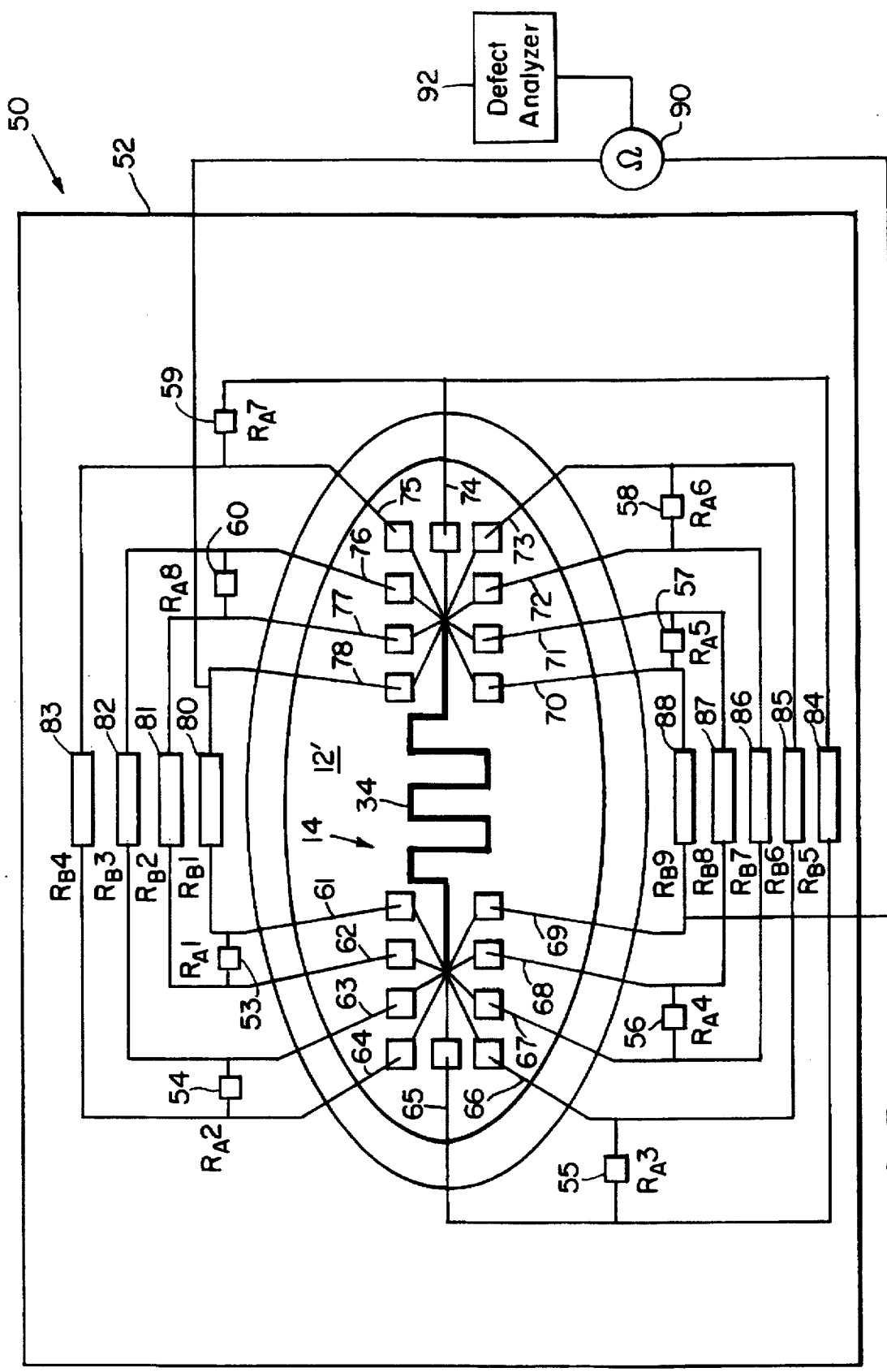
FIG. 3 is a schematic diagram of the probe card device according to this invention for detecting defects formed on the wafer surface.

An apparatus for detecting defects such as probe card device 50, FIG. 3, includes a probe card tester 52 which is positioned above test structure 14 so that area 12' on wafer 10, FIG. 1, can be tested to see if it contains a defect along the meandering metal strips 34. Probe card tester 52 includes a set of series resistors 53–60 ($R_A1$–$R_A8$) of equal resistance for connecting together the ends of conductors 37–45, FIG. 2, through metal contacts 16a and 16b through 32a and 32b, FIG. 2, by means of probe elements 61–78 to form a single series resistance. Probe elements 61–78 protrude through aperture 80 in probe card tester 52. Probe card tester 52 also includes a set of parallel resistors 80–88 ($R_B1$–$R_B9$) of equal resistance interconnected one in parallel with each conductor 37–45, respectively, through probe elements 61–78 to metal contacts 16a and 16b through 32a and 32b. The resistors of both the parallel and series set of resistors are precisely fabricated and thus each resistor within each set have virtually equal resistance values. A single probe card tester 52 can then be used repeatedly to test the resistance of each individual test structure at each chip area 12 on wafer 10, FIG. 1. Because the same resistors are used throughout the testing of wafer 10 highly accurate defect detection and size determination are ensured. Moreover, only a single resistance network on probe card tester 52 must be fabricated as compared to the plurality of resistance networks that are required to be fabricated at each chip area on the surface of a wafer by the prior art technique (See U.S. Pat. No. 4,835,466). Moreover, since the complex resistance network does not need to be fabricated on the wafer surface the simplified test structure according to this invention may be formed on a polysilicon layer of material (assuming the appropriate resistor values of the two sets of resistors are used) instead of being able to only test the metal layer of material with the prior art technique.

An ohmmeter 90 is used to test the resistance of the resistance network to determine if there is a defect bridging one or more of the conductors 37–45, FIG. 2. Ohmmeter 90 is connected across the ends of the resistor network, i.e. from one end of first parallel resistor 79 to one end of the last parallel resistor 87. The resistance measured by ohmmeter 90 is provided to defect analyzer 92, typically a computer, which determines the type and size of defect corresponding to the measured resistance. The operation of defect analyzer 92 is described in more detail below.

Figure 4A:
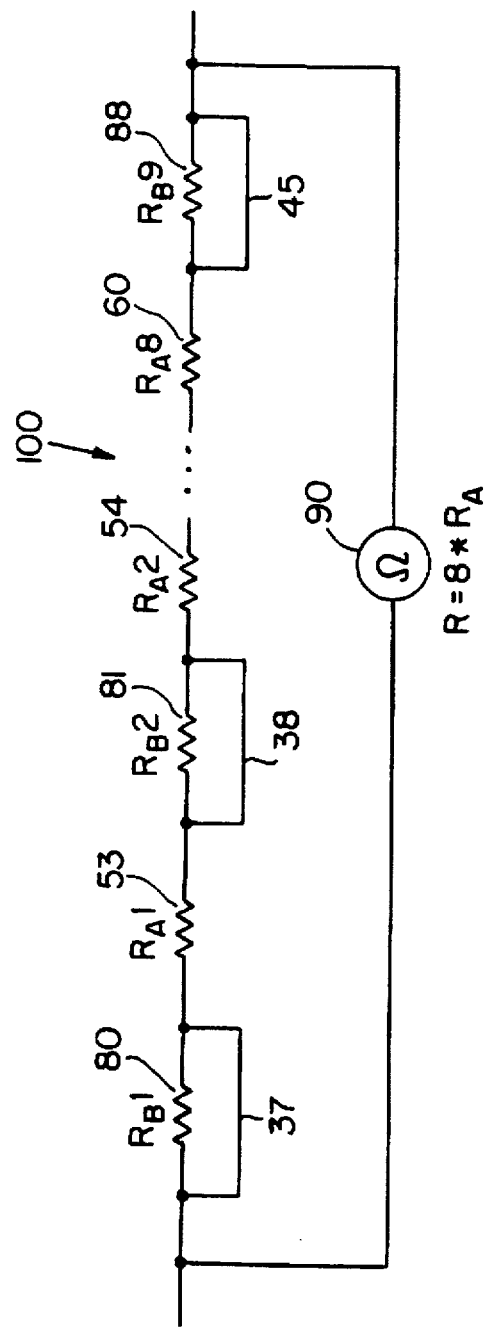
FIG. 4A is an equivalent circuit of the resistor network shown on the probe card tester of FIG. 3 with no defects in the conductor test structure.

Equivalent circuit 100, FIG. 4A, depicts the equivalent circuit formed by the sets of series and parallel resistors on probe card tester 52, FIG. 3, when there are no defects present along metal strips 34 formed on surface 12'. It can be seen that series resistors 53–60 are all part of the circuit while parallel resistors 80-88 are shorted by conductors 37–45 and do not form part of the equivalent circuit. Thus, the resistance seen by ohmmeter 90 when no defects are present is:

$$R=8*R_A \qquad (1)$$

Figure 4B:
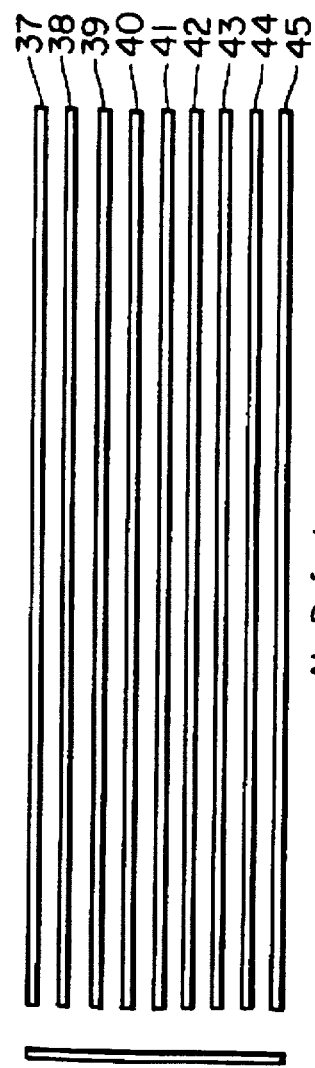
FIG. 4B is a top schematic view of the actual conductors of the test structure of FIG. 4A with no defects.

The full length of conductors 37–45, FIG. 4B, shown for clarity sake to be in straight fines instead of in their actual meandering pattern, have no defects bridging one or more of the conductors.

Figure 5A:
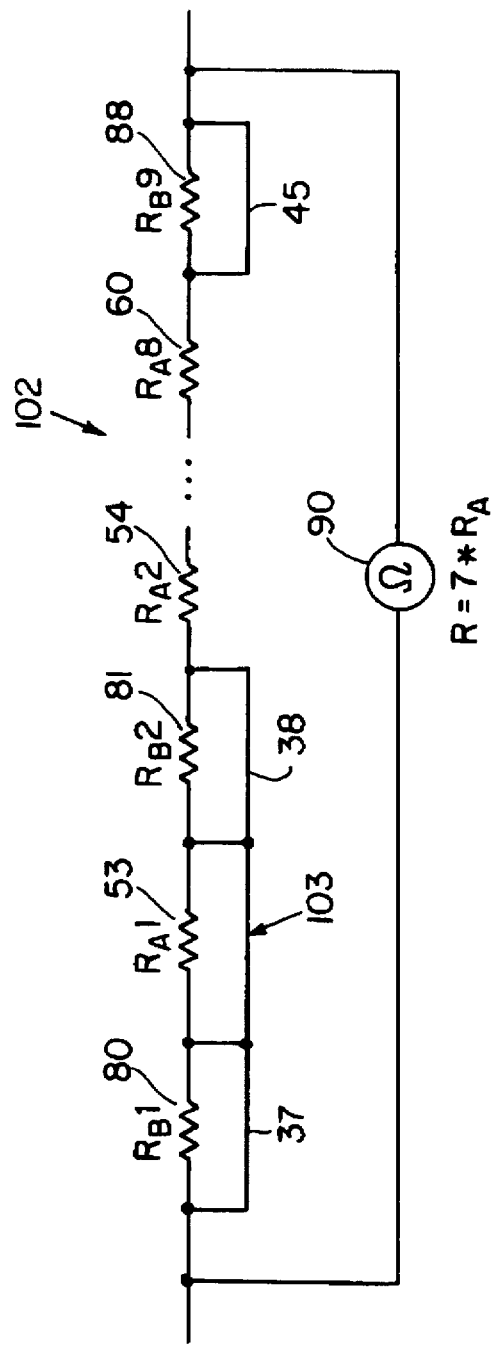
FIG. 5A is an equivalent circuit of the resistor network of FIG. 3 with a shorting defect across two of the conductors in the test structure.

Equivalent circuit 102, FIG. 5A, is the same as equivalent circuit 100, FIG. 4A, except that series resistor 53 is shorted as represented by shunt 103 from equivalent circuit 102 resulting in a resistance, as seen by ohmmeter 90, equal to:

$$R=7*R_A \qquad (2)$$

Figure 5B:
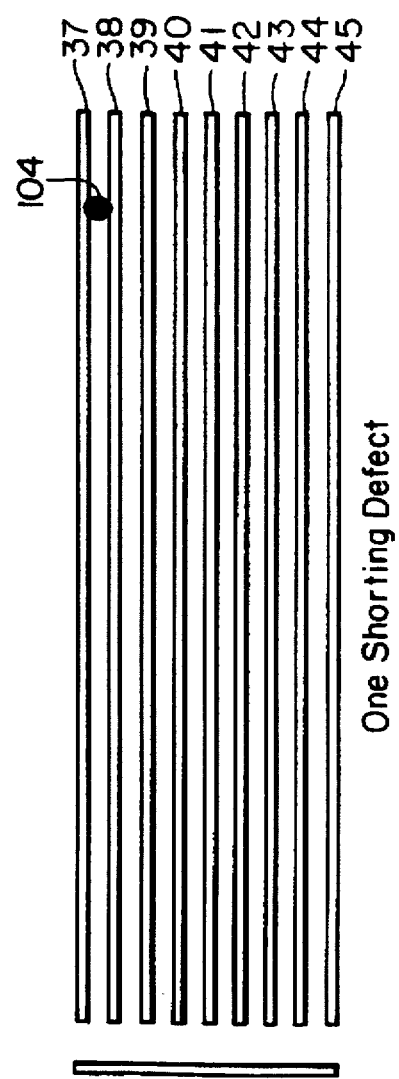
FIG. 5B is a top schematic view of the actual conductor test structure of FIG. 5A depicting the shorting defect.

The shorting of series resistor 53 represented by shunt 103, FIG. 5A, is caused by defect 104, FIG. 5B, which bridges conductors 37 and 38. This shorting type defect may be caused by, for example, extra metal material.

Figure 6A:
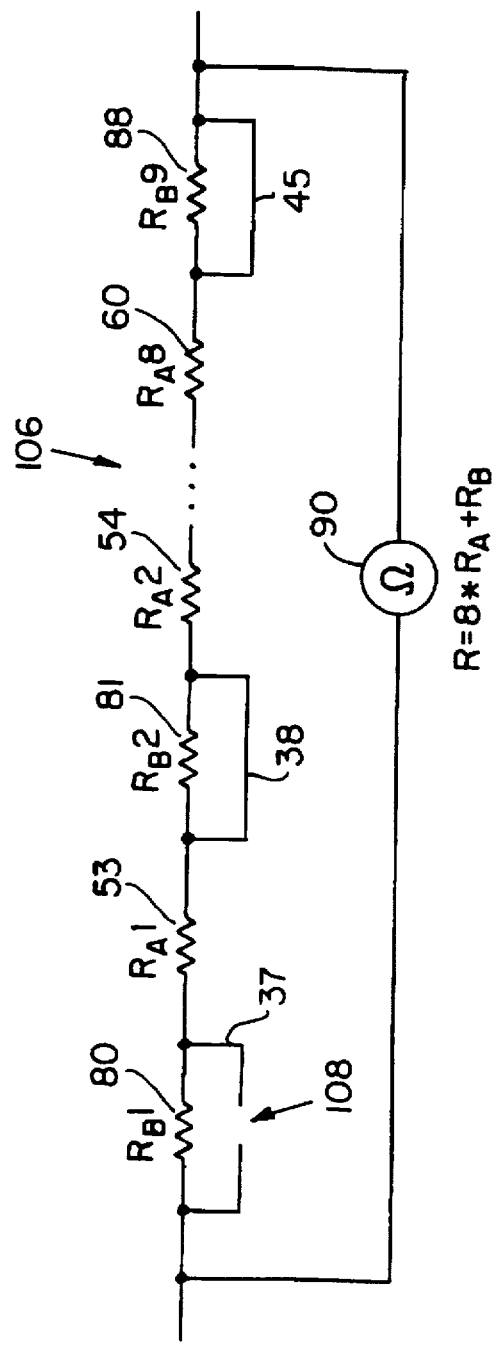
FIG. 6A is the equivalent circuit of the resistor network of FIG. 3 depicting an open type defect in one of the conductors of the test structure.

Equivalent circuit 106, FIG. 6A, depicts the resistance seen by ohmmeter 90 when there is an open type defect in conductor 37 as indicated by open circuit 108. The resistance of equivalent circuit 106 is:

$$R=(8*R_A)+R_B \qquad (3)$$

Figure 6B:
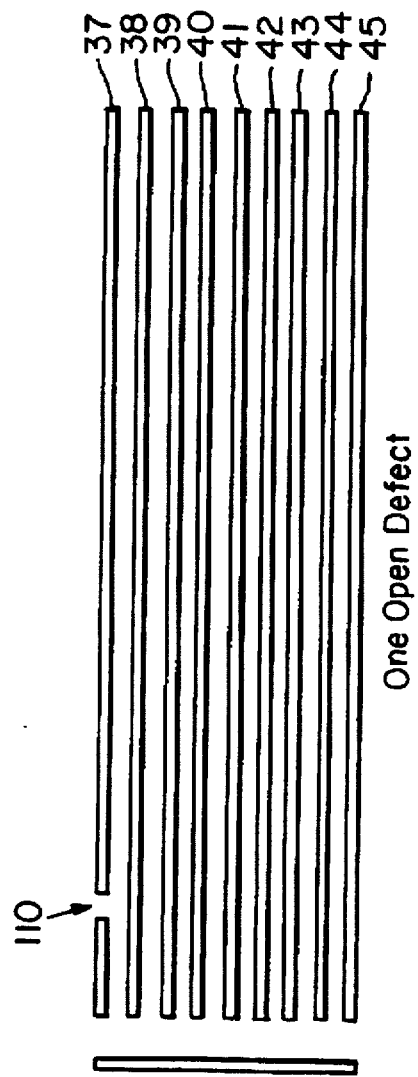
FIG. 6B is a top schematic view of the actual conductors of the test structure of FIG. 6A depicting the open type defect.

Open circuit 108, FIG. 6A, is caused by an open type defect 110, FIG. 6B, in conductor 37.

Chart 120, FIG. 7, illustrates various resistance values, stored within defect analyzer 92, FIG. 3, which will be measured by ohmmeter 90 for different size open and short type defects detected. Because the conductor width and spacing is known, the size of the defect causing either an open circuit or short circuit can be determined by determining how many conductors are shorted or opened.

Figure 8:
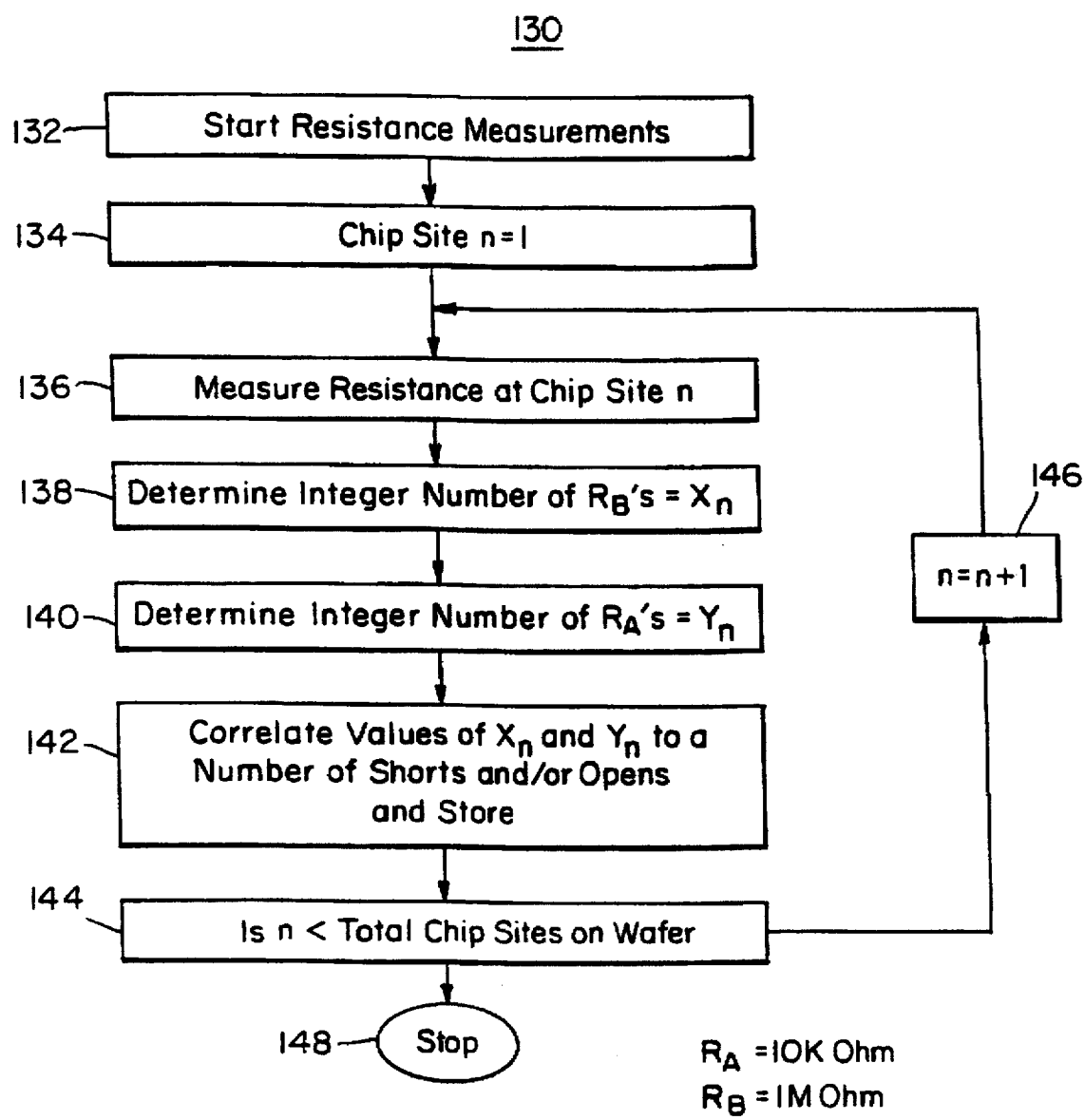
FIG. 8 is a flow chart depicting the operation of the defect analyzer of FIG. 3.

Defect analyzer 92 operates according to flow chart 130, FIG. 8. Flow chart 130 begins at step 132 where the resistance measurements are begun. At step 134 the chip site n is set equal to 1 and at step 136 the resistance at chip site n is determined. At step 138 the integer number of $R_B$ resistance values is determined and set equal to $X_n$. At step 140 the integer number of $R_A$ resistance values is determined and set equal to $Y_N$. In this example $R_A$ is equivalent to 10 kilohms and $R_B$ is equal to 1 megohm. At step 142 the values of $X_n$ and $Y_n$ are correlated to a number of shorts and/or opens as set forth in table 120, FIG. 7 and these values $X_n$ and $Y_n$ and the corresponding number of shorts and opens are stored. At step 144 it is determined if the total number of chip sites on the wafer is greater than n and if the total number of chip sites is greater than n, at step 146 n is incremented by 1 and the system returns to step 136. If the total number of chip sites on the wafer is not greater than n, at step 148 the operation is stopped.

Although specific features of this invention are shown in some drawings and not others, this is for convenience only as each feature may be combined with any or all of the other features in accordance with the invention.

Other embodiments will occur to those skilled in the art and are within the following claims:

What is claimed is:

1. A probe card device for detecting defects occurring as a result of integrated circuit processing of a substrate having a plurality of spaced conductors with a contact at each end of each conductor, the probe card device comprising:
   a probe card tester including a set of parallel resistors for connecting at least one resistor in parallel with each conductor and a set of series resistors for connecting together the ends of said conductors to form a series resistance and a number of probe elements, one corresponding to each end of each conductor, for enabling shunting of each parallel resistor with the corresponding conductor in the no-defect mode, shunting of each series resistor between shorted conductors in the shorting-defect mode and un-shunting of each parallel resistor whose corresponding conductor has an open circuit in the open-defect mode.

2. The probe card device of claim 1 in which said substrate is an integrated circuit chip wafer.

3. The probe card device of claim 1 in which said conductors are configured in a meandering pattern.

4. The probe card device of claim 1 in which said conductors are substantially one micrometer in width and spaced one micrometer apart.

5. The probe card device of claim 1 further including means for detecting defects bridging said conductors.

6. The probe card device of claim 5 in which said means for detecting includes means for measuring the resistance of said series resistance.

7. The probe card device of claim 6 in which said means for detecting further includes means, responsive to said means for measuring, for determining the size and type of defects bridging said conductors.

8. An apparatus for detecting defects arising as a result of integrated circuit processing comprising:
a substrate having a plurality of spaced conductors; and
a probe card tester including a set of parallel resistors for connecting at least one resistor in parallel with each conductor and a set of series resistors for connecting together the ends of said conductors to form a series resistance and a number of probe elements, one corresponding to each end of each conductor, for enabling shunting of each parallel resistor with the corresponding conductor in the no-defect mode, shunting of each series resistor between shorted conductors in the shorting-defect mode and un-shunting of each parallel resistor whose corresponding conductor has an open circuit in the open-defect mode.

9. The apparatus of claim 8 in which said substrate is an integrated circuit chip wafer.

10. The apparatus of claim 8 in which said conductors are configured in a meandering pattern.

11. The apparatus of claim 8 further including means for detecting defects bridging said conductors.

12. The apparatus of claim 11 in which said means for detecting includes means for measuring the resistance of said series resistance.

13. The apparatus of claim 12 in which said means for detecting further includes means, responsive to said means for measuring, for determining the size and type of defects bridging said conductors.

14. The method for detecting defects arising as a result of integrated circuit processing comprising:
fabricating a substrate having a plurality of spaced conductors;
forming, on a separate probe card tester, a set of parallel resistors for connecting at least one in parallel with each said conductor and a set of series resistors for connecting together the ends of said conductors to form a single series resistance;
shunting each parallel resistor with the corresponding conductor in the no-fault mode;
shunting each series resistor between shorted conductors in the shorting-defect mode; and
un-shunting each parallel resistor whose corresponding conductor has an open circuit in the open-defect mode.

15. The method of claim 14 in which said substrate is an integrated circuit chip wafer.

16. The method of claim 14 in which the step of fabricating includes configuring said plurality of spaced conductors in a meandering pattern.

17. The method of claim 14 in which the step of fabricating includes forming said plurality of space conductors substantially one micrometer in width and spaced one micrometer apart.

18. The method of claim 14 in which a further step of detecting includes measuring the resistance of said series resistance.

19. The method of claim 18 in which the step of detecting further includes determining from the measured resistance the size and type of defects bridging said conductors.

* * * * *